(12) United States Patent
Satomi et al.

(10) Patent No.: US 7,099,197 B2
(45) Date of Patent: Aug. 29, 2006

(54) SEMICONDUCTOR MEMORY DEVICE

(75) Inventors: Katsuji Satomi, Osaka (JP); Hironori Akamatsu, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 148 days.

(21) Appl. No.: 10/772,323

(22) Filed: Feb. 6, 2004

(65) Prior Publication Data

US 2004/0156230 A1    Aug. 12, 2004

(30) Foreign Application Priority Data

Feb. 7, 2003    (JP)    ............... 2003-030344

(51) Int. Cl.
*G11C 16/06*    (2006.01)

(52) U.S. Cl. ............... 365/185.23; 365/230.06; 365/149

(58) Field of Classification Search ............... 365/149, 365/102, 189.11, 204, 230.06, 185.23; 307/109
See application file for complete search history.

(56) References Cited

U.S. PATENT DOCUMENTS

| | | | | |
|---|---|---|---|---|
| 5,297,078 A | * | 3/1994 | Yamaguchi | ............... 365/149 |
| 5,361,237 A | * | 11/1994 | Chishiki | ............... 365/230.06 |
| 5,371,705 A | * | 12/1994 | Nakayama et al. | ..... 365/185.23 |
| 5,396,459 A | * | 3/1995 | Arakawa | ............... 365/185.29 |
| 5,455,789 A | * | 10/1995 | Nakamura et al. | ...... 365/185.17 |
| 5,875,133 A | | 2/1999 | Miyashita et al. | |
| 5,973,963 A | * | 10/1999 | Sugawara | ............... 365/185.23 |
| 5,978,263 A | * | 11/1999 | Javanifard et al. | ...... 365/185.11 |
| 5,999,475 A | * | 12/1999 | Futatsuya et al. | ............ 365/226 |
| 6,101,126 A | * | 8/2000 | Chung et al. | ........... 365/185.23 |
| 6,813,216 B1 | * | 11/2004 | Lee | ............... 365/230.06 |
| 6,816,418 B1 | * | 11/2004 | Hidaka | ............... 365/189.09 |

FOREIGN PATENT DOCUMENTS

JP        02118992        5/1990

* cited by examiner

*Primary Examiner*—Richard Elms
*Assistant Examiner*—Eric J. Wendler
(74) *Attorney, Agent, or Firm*—Stevens, Davis, Miller & Mosher, LLP

(57) ABSTRACT

A semiconductor memory device may include: (1) a word line drive circuit, having a drive transistor disposed between a positive power supply and a word line, (2) a circuit for turning the drive transistor OFF after an output of the word line drive circuit reaches a high level, and (3) a word-line-voltage increasing circuit for increasing a voltage of the word line after the drive transistor turns OFF. The word-line-voltage increasing circuit includes a coupling capacitor, one end of which is connected to the word line, and a capacitor drive circuit, an output end of which is connected to the other end of the coupling capacitor. The capacitor drive circuit switches its output from a low level to a high level at a timing when the drive transistor is OFF.

13 Claims, 10 Drawing Sheets

SEMICONDUCTOR MEMORY DEVICE

BACKGROUND OF THE INVENTION

1. Field of the Invention

A present invention relates to a semiconductor memory device, and more particularly to the partial structure of a word line drive circuit.

2. Related Art

Scaling for power supply voltage is effective for reduction of power consumption of a CMOS semiconductor integrated circuit. However, in the case of an SRAM widely used in a system LSI, scaling for power supply voltage tends to occur degradation of characteristics caused by the construction of a memory cell circuit. The main reason is that variation of threshold voltage occurred the back bias effect remarkably reduces current performance when a power supply voltage is low. The back bias effect is caused by potential isolation of a source drain of an access transistor from a substrate potential.

Thus, the performance of releasing the charge on bit lines is reduced in the SRAM in reading. Accordingly, the bit line delay increases. Additionally, in writing, time for rewriting hold data increases. Moreover, when the voltage is extremely low, it is impossible to rewrite in a DC manner.

In order to reduce such characteristic degradation, the power supply voltage supplied to a word line is higher than the other circuit portions in a related art.

FIG. 9 is a circuit diagram showing a construction of a semiconductor memory device in a related art. FIG. 9 shows one word line, a word line drive circuit for driving it, and memory cells connected to the word line (For example, Japanese Laid-Open Publication Kokai No. HEI 2-118992 (page 2–3, FIG. 1)).

In FIG. 9, reference numerals 11 and 12 represent a p-channel drive transistor and an n-channel drive transistor for driving a word line WL, respectively. Reference numeral 44 represents a level shift circuit. A word line drive circuit 400 is composed of them. Reference numeral 17 represents a memory cell.

A gate of an access transistor of a plurality of memory cells 17 is connected to the word line WL. An input NWL of the word line drive circuit 400 is provided to each gate of the p-channel drive transistor 11 and the n-channel drive transistor 12 through the level shift circuit 44.

A power supply voltage VDDH supplied to the p-channel drive transistor 11 and the n-channel drive transistor 12 is higher than a power supply voltage VDDL of the memory cell 17, and a high-level potential VDDL of the input NWL of the word drive circuit 400.

As shown in FIG. 10, when the input NWL of the word line drive circuit 400 changes to a low level, the p-channel drive transistor 11 turns ON, and then the voltage VDDH higher than the power supply voltage VDDL of the memory cell 17 is supplied to the word line WL. Thus, performance deterioration caused by the back bias effect of the access transistor in the memory cell 17 is reduced, and operating characteristics are improved.

When the input NWL of the word line drive circuit 400 is a high level, the level shift circuit 44 pulls up the gate input of the p-channel drive transistor 11 to the VDDH level. The level shift circuit 44 plays a role to reduce the subthreshold leakage current in an OFF state of the p-channel drive transistor 11.

Thus, almost all the portions of the SRAM circuit are operated at a low power supply voltage, and only the word line drive circuit 400, which is even a small portion, is operated at a high voltage. Accordingly, power consumption can be effectively reduced without characteristic degradation.

However, in the above related art, one more power supply voltage is required. Accordingly, the layout design of an LSI chip should be complicated. Additionally, two areas for power supply wiring are required. Therefore, the chip area increases. Moreover, two power supply circuits are required for the design of a system side using such a semiconductor device. This increases substrate mount area. Such a semiconductor device has a disadvantage in cost.

When the system side has one power supply and one more power supply circuit is separately provided on the chip, its chip area further increases.

SUMMARY OF THE INVENTION

It is an object to provide a semiconductor memory device capable of simplifying the layout design of an LSI chip, and of reducing the chip area. In a semiconductor memory device of the present invention, one power supply and one area for power supply wiring are only required.

To achieve the above object, a semiconductor memory device of the first invention, comprises a word line drive circuit including a drive transistor, which drives a word line; a circuit for turning the drive transistor OFF after an output of the word line drive circuit reaches a high level; and a word-line-voltage increasing circuit for increasing a voltage of the word line after the drive transistor turns OFF. The word-line-voltage increasing circuit includes a coupling capacitor, one end of which is connected to the word line, and a capacitor drive circuit, an output end of which is connected to the other end of the coupling capacitor. The capacitor drive circuit switches its output from a low level to a high level at a timing when the drive transistor is OFF.

In this construction, the word line becomes a high impedance in the high-level state. Since the capacitor drive circuit, which includes the coupling capacitor between the word line and the capacitor drive circuit, switches the output from a low level to a high level, the word line potential is pulled up to a potential higher than the high-level potential.

In the word-line-voltage increasing circuit according to the present invention, the capacitor drive circuit, which includes a coupling capacitor, is used between the word line and the capacitor drive circuit as a circuit to increase a voltage of the word line. Accordingly, an increased potential can be obtained without supplying a voltage higher than other circuit portions. It is possible to provide a semiconductor memory device capable of simplifying the layout design of an LSI chip, and of reducing the chip area. In the semiconductor memory device, one power supply and one area for power supply wiring are only required. Moreover, one power supply circuit is only required for the design of a system side using such a semiconductor device. This can reduce substrate mount area. Such a semiconductor device has an advantage in cost.

In the semiconductor memory device of the first invention, a memory cell connected to the word line is a static memory cell, for example.

In addition, in the semiconductor memory device of the first invention, the coupling capacitor includes a line running along the word line, for example.

In this construction, a line running along the word line is formed in a memory array area in an upper wiring layer above the wiring layer where the word line is formed.

Accordingly, it is not necessary to provide a separated area where the coupling capacitor is formed. It is possible to prevent increasing area.

In addition, when there is space in the periphery of the word line, the line running along the word line may be formed in the same layer where the word line is formed. In this case, a similar effect can be obtained.

The above line running along the word line may have different length from the word line. According to this construction, the value of a coupling capacitor, or as an increased voltage level can be adjusted by adjusting the length of the line running along the word line.

Additionally, in the semiconductor memory device further comprising a predetermined number of memory cell arrangement data arranged in the word-line running direction, the memory cell arrangement data may include a first memory cell arrangement data which has the word line and the line running along the word line of a memory cell arrangement unit, and a second memory cell arrangement data which has the word line of a memory cell arrangement unit, and does not have the line running along the word line. In this case, a necessary number of the first memory cell arrangement data to obtain a predetermined value of the coupling capacitor is continuously arranged in the predetermined number of memory cell arrangement data, and the other arranged memory cell arrangement data is the second memory cell arrangement data.

Since two kinds of memory cell arrangement data with or without the line running along the word line are prepared, in this construction, the value of the coupling capacitor can be changed by replacing one kind of memory cell arrangement data with another. It is easy to form the coupling capacitor by a layout compiler, which generates an SRAM block based on an arbitrary number of bits or words as an input parameter.

In addition, the line running along the word line in the coupling capacitor may be formed in the same wiring layer as the word line, and is divided for every one memory cell unit or every two or more memory cell units connected to the word line. In this case, each divided line running along the word line is backed by other wiring line, which runs along the word line on a layer on or above the word line.

In this construction, the line running along the word line in the coupling capacitor is formed in the same wiring layer of the word line, and is backed by other wiring, which runs along it on the layer on or above the layer of the word line, and is divided. Therefore, even in the case that the periphery space of the word line is limited, when it is impossible to arbitrarily adjust the spacing between the word line and the line running along the word line for forming coupling capacitor in order to adjust the increased voltage level, it is possible to control the value of the coupling capacitor by adjusting the increased voltage level.

In addition, the unit is divided on the basis of the memory cell. Accordingly, in a layout compiler, which generates an SRAM block based on an arbitrary number of bits or words as an input parameter, since the line running along the word line is provided in a cell layout, a coupling capacitor proportional to the number of the arranged memory cells, in other words the length of the word line, is obtained by arranging the memory cells. It is possible to keep the increased voltage level constant.

Additionally, in the semiconductor memory device of the first invention, it is effective to use the output of the word line drive circuit as a control input signal for turning the drive transistor OFF. If the drive transistor turns OFF not after the word line potential reaches a high level, which is the power supply voltage, the potential obtained in voltage-increasing operation performed after that is lower than a predetermined potential level. On the other hand, if there is an interval after the word line reaches a high level until the drive transistor turns OFF, it wastes time.

In the above construction, direct feed back control by the word line signal can perform OFF control of the drive transistor. Accordingly, the difference caused by lacing of a signal is eliminated as compared with the case that a timing control circuit is provided separately, and timing of each operation can be set sequentially. Therefore, it is easy to adjust the timing so as to turn the drive transistor OFF when the word line reaches a high level. Thus, it is possible to reduce the waste time in the increased voltage drop and the sequence of operation Additionally, in the semiconductor memory device of the first invention, it is effective to use the output of the word line drive circuit as an input signal of the capacitor drive transistor. If the capacitor drive circuit operates before the drive transistor turns OFF, the charge stored in the capacitor flows into the drive transistor, which turns ON. Accordingly, a predetermined increased voltage level cannot be obtained. On the other hand, if there is an interval after the drive transistor turns OFF until the capacitor drive circuit operates, it wastes time.

In the above construction, the input signal of the capacitor drive circuit acts as the word line signal. Accordingly, it is easy to adjust the operate timing of the capacitor drive circuit to the timing for turning the drive transistor OFF. Thus, it is possible to reduce the increased voltage drop and the waste time in the sequence of operation.

Moreover, in the semiconductor memory device of the first invention, it is preferable that a writing control signal is provided to the word-line-voltage increasing circuit, the word-line-voltage increasing circuit increases a voltage of the word line only in writing. When required operation speed is not so high in the whole of semiconductor integrated circuit, it is effective for the reduction in power consumption to reduce the whole power supply voltage. However, as mentioned above, in writing operation in an SRAM, a margin of operation reduces in DC operation. This causes the bottleneck of the minimum of operation. On the other hand, although reading operation affects speed, it is possible to operate even at low voltage, when sense timing is adjusted. If the gate potential of the access transistor rises by the increased voltage of the word line, the noise margin, which is the data holding characteristic, deteriorates. When the word line turns ON, the possibility of data corruption may be high caused by data inversion.

In the above construction, a writing control signal is provided to the word-line-voltage increasing circuit, the word-line-voltage increasing circuit increases a voltage of the word line only in writing. Accordingly, it is possible to effectively improve the minimum voltage of operation without fine adjustment of the increased voltage of the word line in order to prevent data corruption in reading.

Moreover, in the construction of first invention, it is preferable that a column decoding signal is provided to the word-line-voltage increasing circuit as a control signal, a signal of a global word line is provided to the word line drive circuit, a plurality of the word line drive circuits are connected to the global word line, the column decoding signal selects whether the word-line-voltage increasing circuit is activated or not in wiring. Generally, an SRAM does not have an extremely longitudinal block shape in the vertical direction nor the transverse direction. A plurality of addresses of memory cells is connected to one word line. In this case, the access transistor also turns memory cells ON other than the memory cell to be written in writing operation. Therefore, the possibility of data corruption may be high caused by the increased gate voltage.

In the above construction, a voltage of the word line is increased only in the memory cell to be written, which is selected by the column address in writing. Accordingly, while data corruption of the non-activated memory cell is prevented, the block shape can be adjusted.

According to the effects of the invention, while area overhead is reduced, an increased potential of the word line can be obtained. Consequently, bottleneck of the minimum voltage of operation can be prevented, and the other circuits can operate at a low voltage. Therefore, it is possible to achieve low power consumption.

The semiconductor memory device of the second invention comprises a word line drive circuit including a drive transistor, which drives a word line; a circuit for turning the drive transistor OFF after an output of the word line drive circuit reaches a high level; and a word-line-voltage increasing circuit for increasing a voltage of the word line after the drive transistor turns OFF. In addition, the word-line-voltage increasing circuit is a switch circuit, which is provided between a voltage supply, which supplies a voltage higher than a power supply voltage supplied to the word line drive circuit, and the word line, the switch circuit turns ON after the drive transistor turns OFF.

In this construction, the increased voltage is applied to the word line through the switch circuit. Accordingly, it is possible to increase the voltage applied to the word line. As a related art, if the word line drive circuit is driven at a high voltage as the power supply voltage, the word line potential should be uniquely determined by the word line drive circuit. In the present invention, the switch circuit is separately provided between a voltage supply, which supplies a voltage higher than the power supply voltage supplied to the word line drive circuit other than the word line drive circuit, and the word line, and a high voltage is applied to the word line through the switch circuit. Accordingly, it is also possible to change the voltage applied to the word line by providing a desired control signal to the switch circuit according to the operation mode of a semiconductor memory device. For example, it is possible to control the word line potential so as to change the word line potential to different potentials according to writing operation and reading operation of the word line drive circuit.

In the semiconductor memory device of the second invention, a signal is provided to the switch circuit from the word line drive circuit as an ON/OFF control signal, the switch circuit includes a level conversion circuit, which changes the signal from the word line drive circuit into the voltage higher than the power supply voltage supplied to the word line drive circuit.

In this construction, the difference between the power supply voltage, which is supplied to the switch circuit, and the switch control signal voltage is eliminated. Accordingly, the leakage current produced in the OFF state of the switch circuit can be eliminated effectively.

In addition, in the semiconductor memory device of the second invention, it is preferable that a writing control signal is provided to the switch circuit as an ON/OFF control signal, the switch circuit responds to the signal from the word line drive circuit only in writing.

In this construction, a writing control signal is provided to the switch circuit as an ON/OFF control signal, the switch circuit responds to the signal from the word line drive circuit only in writing. Accordingly, it is possible to increase a voltage only in writing, and data corruption in reading can be prevented. As a related art, if the word line drive circuit is driven at a high voltage as the power supply voltage, the word line potential should be uniquely determined by the word line drive circuit. For example, it is impossible to control the word line potential so as to change it to different potentials according to writing operation and reading operation of the word line drive circuit, in a related art. In the present invention, the switch circuit is separately provided between a voltage supply, which supplies a voltage higher than the power supply voltage supplied to the word line drive circuit other than the word line drive circuit, and the word line, and a high voltage is applied to the word line through the switch circuit. Therefore, even when the word line is driven according to the operation of the word line drive circuit, it is possible to control the word line potential so as to change it to different potentials according to writing operation and reading operation of the word line drive circuit.

DESCRIPTION OF THE PREFERRED EMBODIMENTS

The following description will describe the embodiments according to the present invention with reference to the drawings.

Embodiment 1

Figure 1:
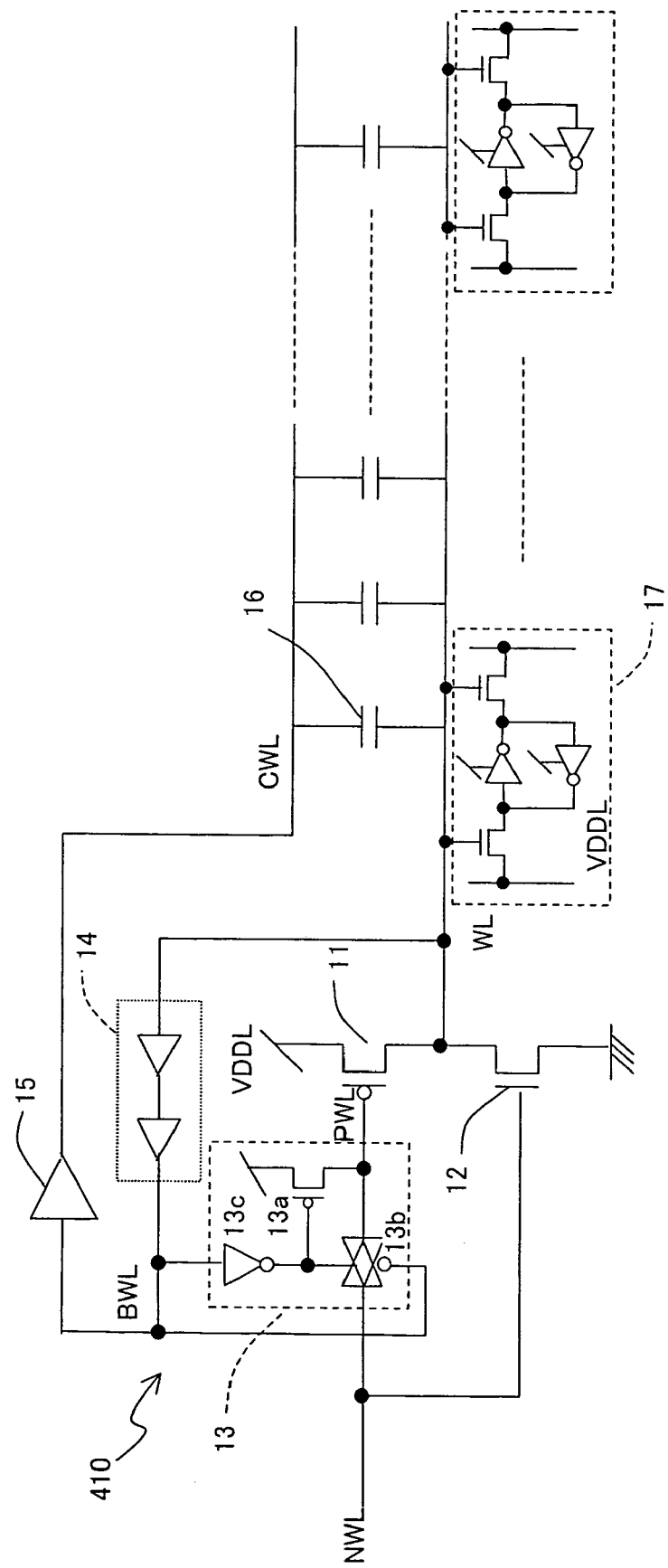
FIG. 1 is a circuit diagram showing a word line drive circuit of a semiconductor memory device according to an embodiment 1 of the present invention.

FIG. 1 is a circuit diagram showing a construction of a semiconductor memory device according to an embodiment 1 of the present invention. FIG. 1 shows one word line, a word line drive circuit for driving it, and memory cells connected to the word line.

In FIG. 1, reference numerals 11 and 12 represent a p-channel drive transistor and an n-channel drive transistor for driving the word line WL, respectively. Reference numeral 13 represents an OR circuit, which includes a pull-up transistor 13a, a transfer gate 13b, and an inverter 13c. Reference numeral 14 represents a timing adjusting circuit. Reference numeral 15 represents a capacitor drive circuit. Reference numeral 16 represents a coupling capacitor, one end of which is connected to the word line WL, and the other end is connected to an output end of the capacitor drive circuit 15. The word line drive circuit 410 is composed of them. Reference numeral 17 represents the memory cell.

A gate of the n-channel drive transistor 12 is directly controlled by an input NWL provided to the word line drive circuit 410. A gate node PWL of the p-channel drive transistor 11 is controlled through the OR circuit 13.

A potential of the word line WL is provided to the timing adjusting circuit 14 as an input. An output signal BWL of the timing adjusting circuit 14 is connected to one input terminal of the OR circuit 13.

The output signal BWL of the timing adjusting circuit 14 is provided to the capacitor drive circuit 15. The capacitor drive circuit 15 drives the coupling capacitor 16, which is provided between the output terminal, which provides an output signal CWL, and the word line WL.

The coupling capacitor 16 includes a line running along the word line in a wiring layer same or above the word line WL.

The memory cell 17 is a six-transistor SRAM memory cell, and a gate of the access transistor is connected to the word line WL.

A potential level VDDL of power supply voltage is supplied to the word line drive circuit 410.

Figure 2:
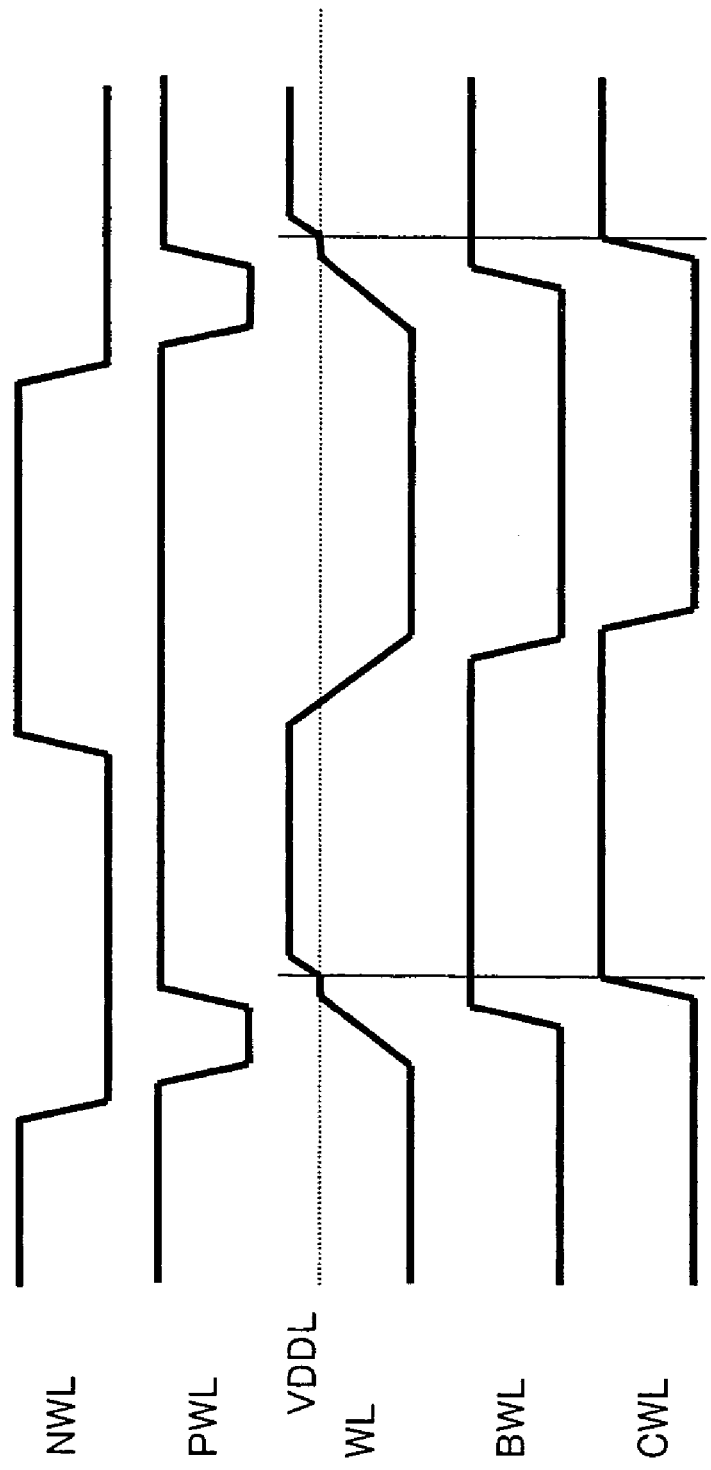
FIG. 2 is a waveform chart showing an operation-timing waveform of a word line drive circuit in a semiconductor memory device according to an embodiment 1 of the present invention.

Operation of the word line drive circuit 410 in FIG. 1 is described with reference to FIG. 2. First, when the input NWL is a high level, the n-channel drive transistor 12 is in an ON state, and the word line WL is a low level. At this time, the output signal BWL of the timing adjusting circuit 14 is also a low level. As a result, the p-channel pull-up transistor 13a in the OR circuit 13 turns OFF, and the transfer gate 13b turns ON. Accordingly, the high-level signal of the input NWL is provided to the gate node PWL. Thus, the p-channel drive transistor 11 is in an OFF state. In addition, the output signal CWL of the capacitor drive circuit 15 is a low level in response to the signal from the timing adjusting circuit 14.

After that, when the input NWL changes to a low level, first, the n-channel drive transistor 12 turns OFF, and the p-channel drive transistor 11 simultaneously turns ON. The p-channel drive transistor 11 drives loads on the word line WL, and pulls up the word line potential to a high level. Then, the output signal BWL of the timing adjusting circuit 14 becomes a high level after a predetermined time. As a result, the transfer gate 13b in the OR circuit 13 turns OFF, and the signal communication of the input NWL is interrupted. The p-channel pull-up transistor 13a simultaneously turns ON, and the gate node PWL becomes a high level. Transmission delay of the timing adjusting circuit 14 is adjusted so as to turn the p-channel drive transistor 11 OFF when the high-level potential of the word line WL reaches the supply voltage VDDL.

Then, the capacitor drive circuit 15 pulls up the output signal CWL to a high level in response to the change of the output signal BWL of the timing adjusting circuit 14 to a high level. Since both the n-channel drive transistor 12 and the p-channel drive transistor 11 are in an OFF state and the word line WL is in a high impedance state at this time, the word line WL is further pulled up to a potential higher than the high-level potential VDDL by the coupling capacitor 16. The pulled-up potential level is previously adjusted to an adequate value of the coupling capacitor against parasitic capacitance (not shown), such as a capacitance to ground of the word line WL.

The power supply voltage VDDL and the increased voltage level can be 1.5 V and 0.3 V, respectively, for example. In the voltage level of 1.5 V, the threshold value voltage of the transistor in the circuit has an influence. Therefore, a remarkable improvement of supply current can be expected even at the increased voltage level of about 0.3 V. In addition, actually, in the diffused junction of the p-channel drive transistor 11, when a voltage is increased, a forward voltage is applied to the junction diode. However, in the case of about 0.3 V, the capacitance of the word line WL does not discharge within several nanoseconds. Accordingly, the increased voltage level is held.

When the input NWL changes from a low level to a high level, the n-channel drive transistor 12 turns ON, and the word line WL changes to a low level similarly to the explanation of the initial operation. The output signal BWL of the timing adjusting circuit 14 also changes to a low level, and the OR circuit 13 provides the input NWL to the gate node PWL similarly. Thus, the p-channel drive transistor 11 remains in an OFF state. The output signal CWL changes to a low level. Although the capacitor drive circuit 15 acts on the word line WL so as to change the word line WL to a level lower than a low level through the coupling capacitor 16, the word line WL does not change its state (low level). The reason is that the n-channel drive transistor 12 is in an ON state.

Thus, according to the embodiment 1 of the present invention, it is possible to apply a high potential to the word line WL without a power supply, which is additionally provided other than the power supply for the other portions in the circuit, only for the word line drive circuit 410. Conventionally, the portion located on an elongation of the word line WL, where a row decoder circuit or the word line drive circuit 410 is provided, tends to have a dead space on the layout of the whole SRAM circuit. For this reason, block size does not become so large even if the number of transistors in the word line drive circuit 410 increases. In addition, the coupling capacitor 16 is provided in the memory cell array area. This does not occur an area overhead. Recently, multi-layer wiring process is widely used. The SRAM memory cell array has enough space. Accordingly, an additional wiring layer is not required.

As described above, since the semiconductor memory device includes a circuit for turning the p-channel drive transistor 11 OFF right after the word line becomes a high level, i.e., the OR circuit 13 and the timing adjusting circuit 14, the word line WL is in a high impedance state. Furthermore, the potential of the word line WL can be a potential higher than the supplied power supply voltage VDDL by a voltage-increasing circuit, i.e. the increased voltage circuit 15 and the coupling capacitor 16.

In addition, since the word line WL becomes a high impedance in the high-level state, the output of the capacitor drive circuit 15, which includes the coupling capacitor 16 between the word line WL and the capacitor drive circuit 15, is turned to a high level from a low level. Accordingly, the word line potential is pulled up to a potential higher than the high-level potential. It is not necessary to supply a voltage higher than other circuit portions, in the construction of this embodiment. It is possible to provide a semiconductor memory device capable of simplifying the layout design of an LSI chip, and of reducing the chip area. In the semiconductor memory device, one power supply and one area for power supply wiring are only required. Additionally, one power supply circuit is only required for the design of a system side using such a semiconductor device. This can reduce a substrate mount area. Such a semiconductor device has an advantage in cost.

Further, OFF control of the p-channel drive transistor 11 is performed by direct feedback of the word line signal. Accordingly, the difference caused by lacing of a signal can be eliminated as compared with the case that a timing control circuit is provided separately, and timing of each operation can be set sequentially. Therefore, it is easy to adjust the timing so as to turn the p-channel drive transistor 11 OFF when the word line WL reaches a high level.

Moreover, the word line signal is provided to the capacitor drive circuit 15 as an input signal. Accordingly, it is easy to adjust the timing for activating the capacitor drive circuit 15 to the timing for turning the p-channel drive transistor 11 OFF.

In addition, although it is not illustrated, a logic circuit, to which writing control signal is provided, may be additionally provided upstream from the capacitor drive circuit 15. This can stop activation of the capacitor drive circuit 15. Accordingly, the capacitor drive circuit 15 can increase a voltage only in writing. Since the capacitor drive circuit 15 increases a voltage only in writing, it is possible to improve the minimum voltage of operation effectively without fine adjustment of the increased voltage of the word line in order to prevent data corruption in reading.

Embodiment 2

Construction examples of coupling capacitor is described with reference to FIG. 3 as an embodiment 2 of the present invention.

An area divided by dashed lines 18 represents a layout area of the memory cell for one bit. A portion, which is divided by the dashed lines 18, of the word line wiring 21 is located in the layout of the memory cell for one bit. Neighboring lines 22 are formed in the same wiring layer as the word line 21. The neighboring lines 22 are connected to an upper layer wiring line 24 through via holes 23. As shown in FIG. 3, all of the divided neighboring lines 22 are connected each other through the upper layer wiring line 24.

Each portion, which is divided by the dashed lines 18, of the neighboring line 22, the via hole 23 and upper layer wiring line 24 is located in the layout of the memory cell for one bit similarly to the word line 21. The wiring shown in FIG. 3 can be obtained by providing this memory layout one by one with flipping (reversing) in the transverse direction.

The coupling capacitor 16 is formed between the word line 21 and the neighboring line 22. Since all memory cells are the same layout shape, the capacitance ratio between a parasitic capacitance, such as a capacitance to ground of the word line 21, and the coupling capacitor 16 does not change regardless of how many memory cells are arranged in the transverse direction. Therefore, in the voltage-increasing circuit using the coupling capacitor 16 formed in this manner, it is possible to keep the increased voltage level constant irrespective of the number of memory cells.

If there is enough space in the layout, the value of the coupling capacitor 16 may be adjusted by changing the spacing between the neighboring line 22 and the word line 21. If space is limited by the arrangement of other wiring, the value of the coupling capacitor may be adjusted by changing the length of the neighboring line 22.

Thus, according to this embodiment, it is possible to adjust the value of the coupling capacitor 16 arbitrarily within a certain range against an arbitrary length of the word line.

In this embodiment, the neighboring line 22 extends two bits of memory cells. However, the neighboring line 22 may be located only one bit of memory cell. On the other hand, the neighboring line 22 may extend units of memory cells according to a unit, which the memory cell is located. Furthermore, the value of the coupling capacitor 16 may be adjusted by changing the spacing between the neighboring line 22 and the word line 21 without dividing the neighboring line 22.

Figure 3:
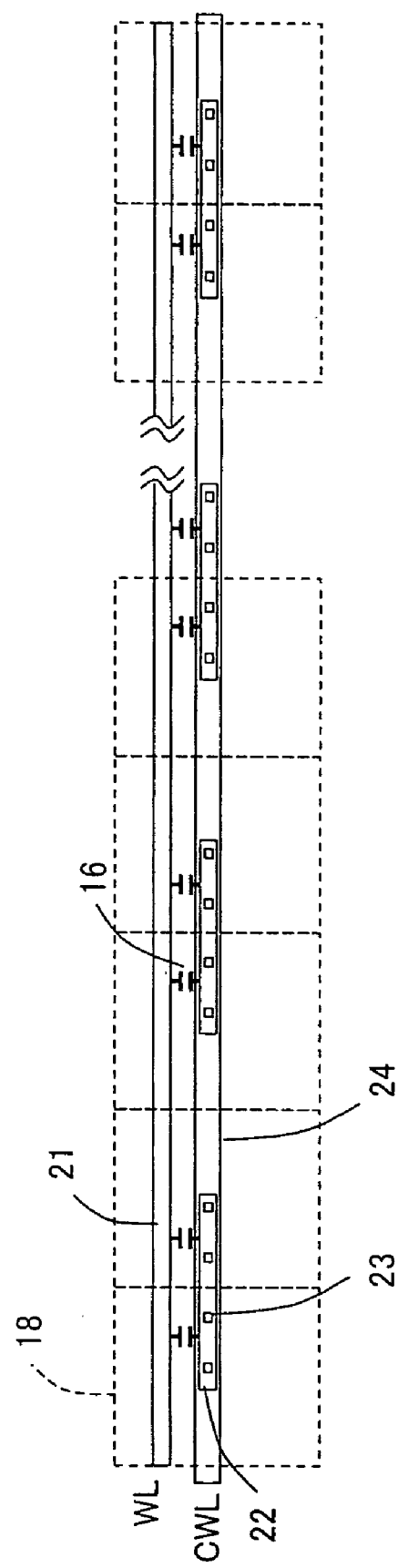
FIG. 3 is a schematic diagram showing a layout of a coupling capacitor of a semiconductor memory device according to an embodiment 2 of the present invention.
Figure 4:
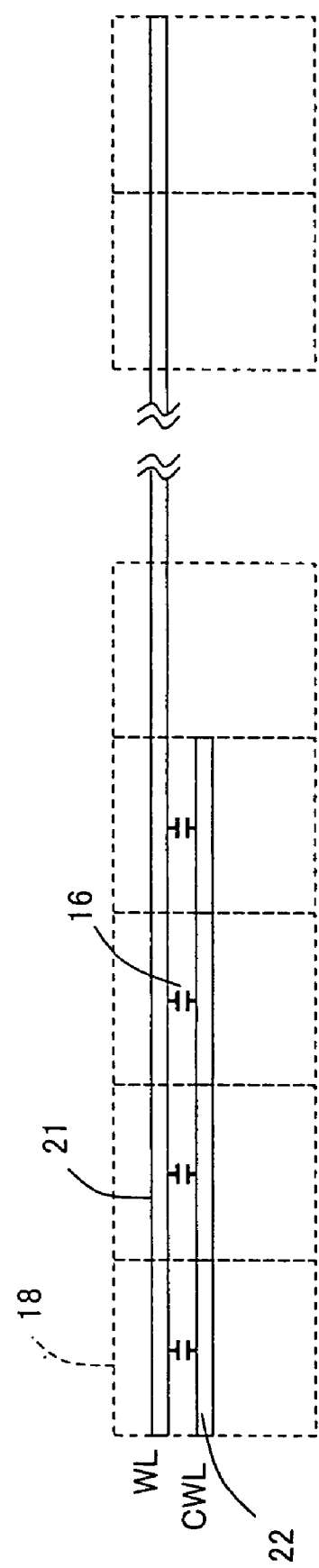
FIG. 4 is a schematic diagram showing a layout of a coupling capacitor of a semiconductor memory device according to an embodiment 2 of the present invention.

Another construction example of the coupling capacitor is shown in FIG. 4. The neighboring line 22 shown in FIG. 4 is not divided but formed of one wiring line contrasted with FIG. 3. A portion, which is divided by the dashed lines 18, of the word line 21 is located in the layout of the memory cell for one bit similarly to the example of FIG. 3. On the other hand, there are the layouts of the memory cells, which have only the word line 21, and do not have the line running along the word line. A necessary number of the layouts of the memory cells, which have neighboring line 22, to obtain a predetermined value of the coupling capacitor is continuously arranged. The other arranged layouts of the memory cells do not have the line running along the word line. Thus, it is possible to change the value of the coupling capacitor by replacing one of the two kinds of memory cell arrangement data with another.

In the examples of FIG. 3 and FIG. 4, the coupling capacitor can be formed by arranging the layouts of the memory cells. It is easy to form the coupling capacitor by a layout compiler, which generates an SRAM block based on an arbitrary number of bits or words as an input parameter.

In this embodiment, the coupling capacitor 16 includes the line running along the word line in the same wiring layer as the word line 21. However, the coupling capacitor 16 may include the line running along the word line in the upper layer above the word line 21. In this case, the value of the coupling capacitor can also be adjusted by shifting the line running along the word line from right above the word line 21.

As described above, the line running along the word line is formed in the layer above the word line 21 in the memory array. Accordingly, it is not necessary to provide the area where the coupling capacitor 16 is formed separately, and it is possible to reduce the chip area. Moreover, when there is space in the periphery of the word line 21, the line running along the word line may be formed in the same layer where the word line 21 is formed. In this case, a similar effect can be obtained.

In addition, the value of the coupling capacitor can be adjusted by the length of the line running along the word line.

Additionally, it is possible to change the value of the coupling capacitor by replacing one of the two kinds of memory cell arrangement data with another. It is easy to form the coupling capacitor by a layout compiler, which generates an SRAM block based on an arbitrary number of bits or words as an input parameter.

Further, even in the case that the periphery space of the word line is limited, when it is impossible to arbitrarily adjust the spacing between the word line and the line running along the word line for forming the coupling capacitor in order to adjust the increased voltage level, it is possible to control the value of the coupling capacitor by dividing the line running along the word line to adjust the increased voltage level. Furthermore, the unit to be divided is a unit on the basis of a memory cell. Accordingly, in a layout compiler, which generates an SRAM block based on an arbitrary number of bits or words as an input parameter, since the line running along the word line is provided in the cell layout, the coupling capacitor proportional to the number of the arranged memory cells, i.e., the word line length, can be obtained by arranging memory cells. It is possible to keep the increased voltage level constant.

Embodiment 3

A word line drive circuit according to an embodiment 3 is described with reference to FIG. 5.

Figure 5:
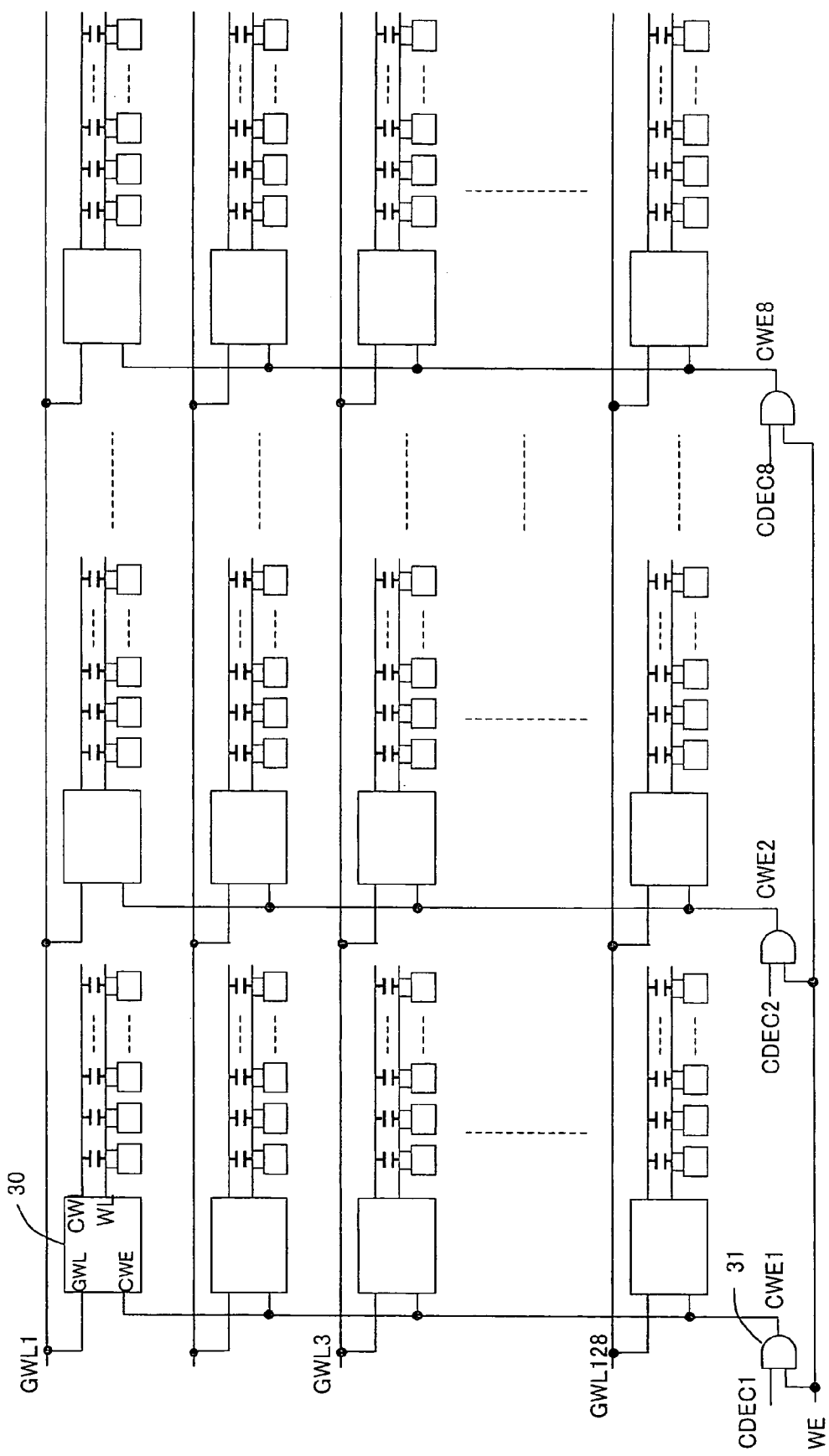
FIG. 5 is a schematic diagram showing an array construction of a memory cell/word line drive circuit of a semiconductor memory device according to an embodiment 3 of the present invention.

In FIG. 5, a word line drive circuit 30 receives one of global word lines GWL1–GWL128, which run in the transverse direction, and one of column writing control signals CWE1–CWE8, which run in the vertical direction as inputs. The column writing control signals CWE1–CWE8 are generated from an AND of column decoding signals CDEC1–CDEC8 and the writing control signal WE by AND circuits 31, respectively.

Figure 6:
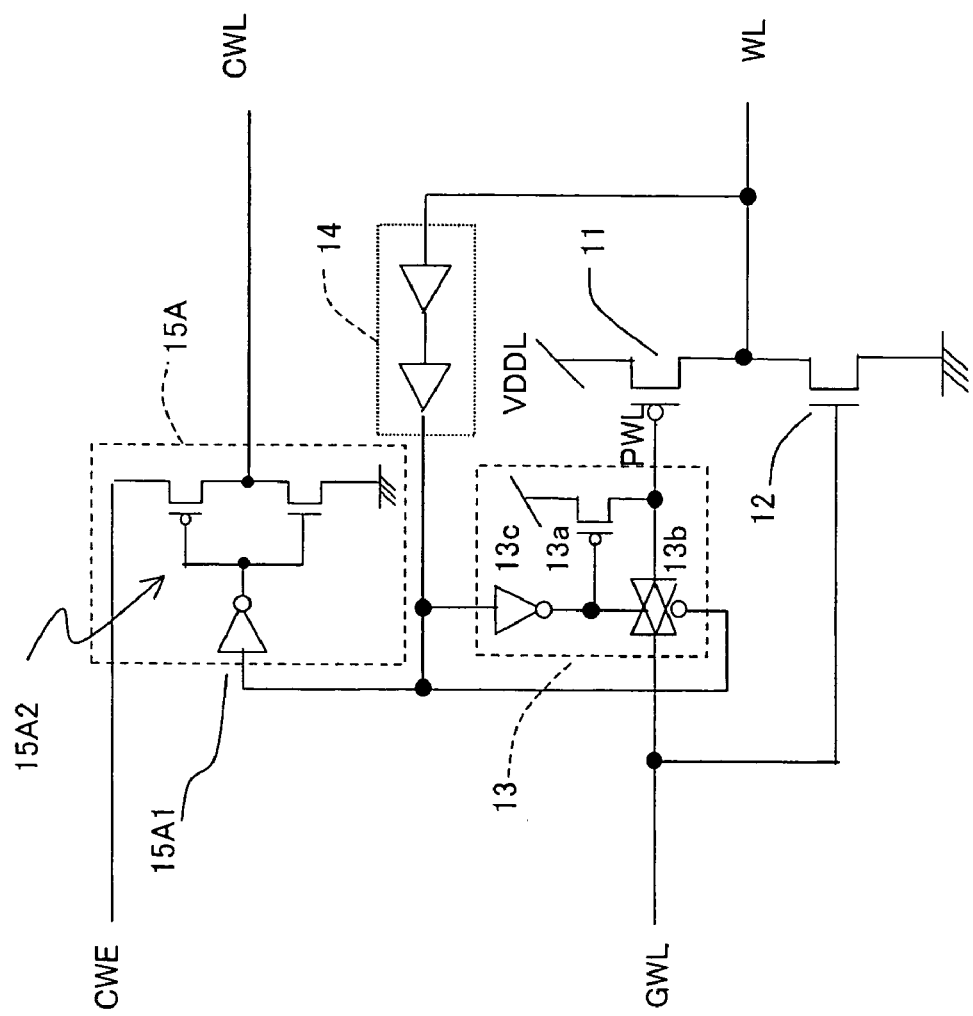
FIG. 6 is a circuit diagram showing a word line drive circuit of a semiconductor memory device according to an embodiment 3 of the present invention.

A concrete example of the word line drive circuit 30 is shown in FIG. 6. In FIG. 6, components with same as or similar function to those in FIG. 1, which shows the embodiment 1, are attached with the same reference letters or numerals, and their description is omitted for ease of explanation.

In a capacitor drive circuit 15A of FIG. 6, a power supply voltage of a downstream side inverter circuit 15A2 of two stages of inverter circuits 15A1 and 15A2, is supplied from the column writing control signal CWE, contrasted with the power supply, which is only VDDL potential for all, of the capacitor drive circuit 15 of FIG. 1. In this construction, only when the column writing control signal CWE is a high level, the capacitor drive circuit 15A is activated and the voltage of the word line WL is increased.

Operation in an array circuit of FIG. 5 in writing is described. First, in writing operation, one of the column writing control signals CWE1–CWE8 becomes a high level. Next, one of the global word lines GWL1–GWL128 becomes a low level, each word line drive circuit 30, to which the low level is provided, is activated, and each word line becomes a high level. At this time, one of the column decoding signals CDEC1–CDEC8 becomes a high level, and is selected. The capacitor drive circuit only in the word line drive circuit 30, to which the high level of the column writing control signals CWE1–CWE8 is provided, is activated and increases a voltage. The column decoding signals CDEC1–CDEC8 are also provided to the writing buffer (not shown) of the memory cell connected to the word line, a voltage of which is increased, and writing is performed for the memory cell where a voltage of the word line is increased. In addition, in reading operation, the column writing control signals CWE1–CWE8 are a low level, and any voltages of the word lines are not increased.

In the word line drive circuit of this embodiment, a voltage of the word line only in the memory cell, which is selected by the column decoding signals CDEC1–CDEC8 and is in writing operation, is increased. Therefore, data corruption caused by noise margin deterioration of the memory cell, which is not in reading operation or is not a subject to be written, can be prevented. Additionally, the word line drive circuit 30 is divided and is arranged for every selected memory cell unit, and the word line drive circuit 30 is selected by the column writing control signals CWE1–CWE8. Accordingly, the number of memory cells arranged in the transverse direction can be increased, and the aspect ratio of a block can be adjusted.

In addition, a high level may be provided only to the word line to be selected by logic of the column decoding signal, which is separated from the writing control signal, and the global word line, in a construction as another embodiment. In this case, the writing control signal controls whether a voltage of the word line is increased. However, in this construction, the number of stages of the word line drive circuit is increased corresponding to the column decoding signal and the logic circuit. Accordingly, the voltage of the word line rises slightly slower. Therefore, in terms of speed, this embodiment has an advantage as compared with another embodiment.

As described above, a voltage of the word line is increased only in the memory cell to be written, which is selected by the column address in writing. Accordingly, while data corruption of the non-selected memory cell is prevented, the block shape can be adjusted.

In addition, since the capacitor drive circuit 15 increases a voltage only in writing, it is possible to effectively improve the minimum voltage of operation without fine adjustment of the increased voltage of the word line in order to prevent data corruption in reading.

Embodiment 4

Figure 7:
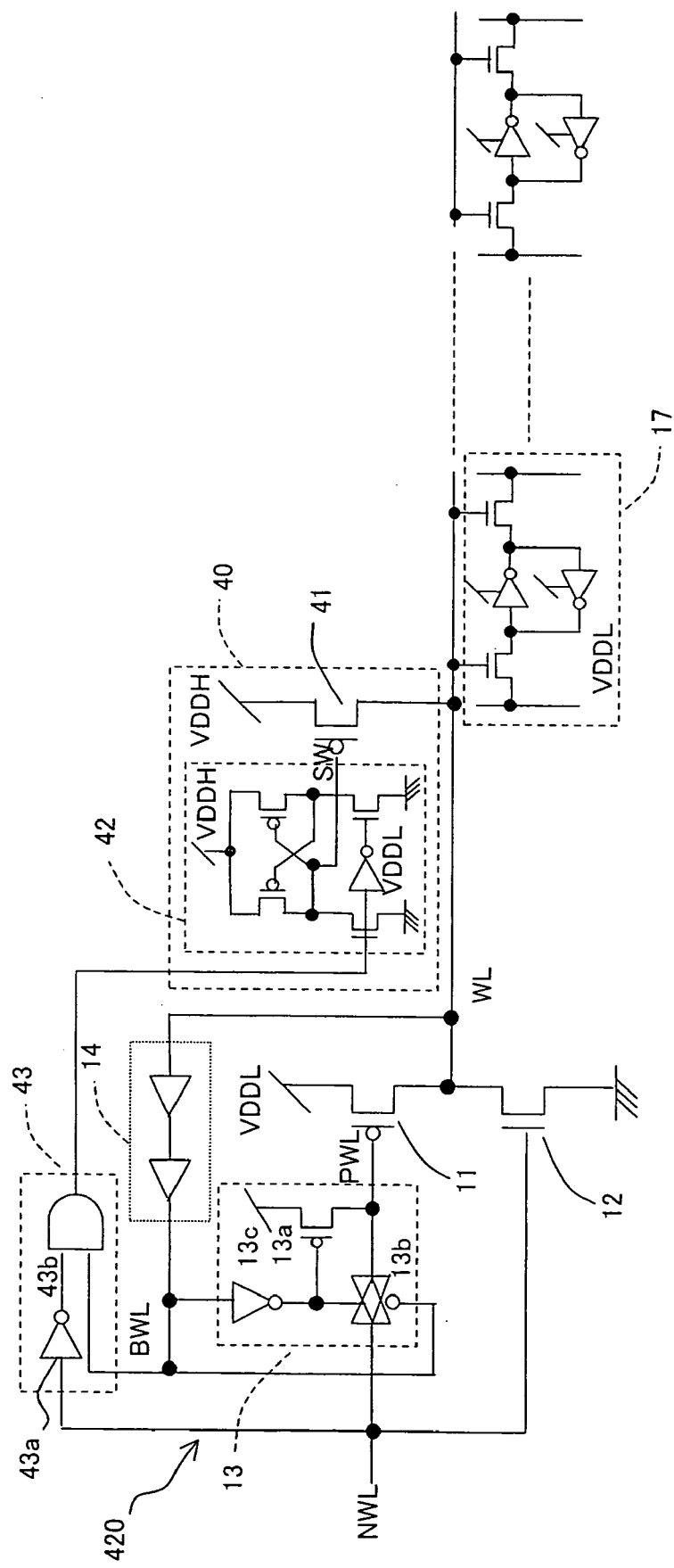
FIG. 7 is a circuit diagram showing a word line drive circuit of a semiconductor memory device according to an embodiment 4 of the present invention.
Figure 8:
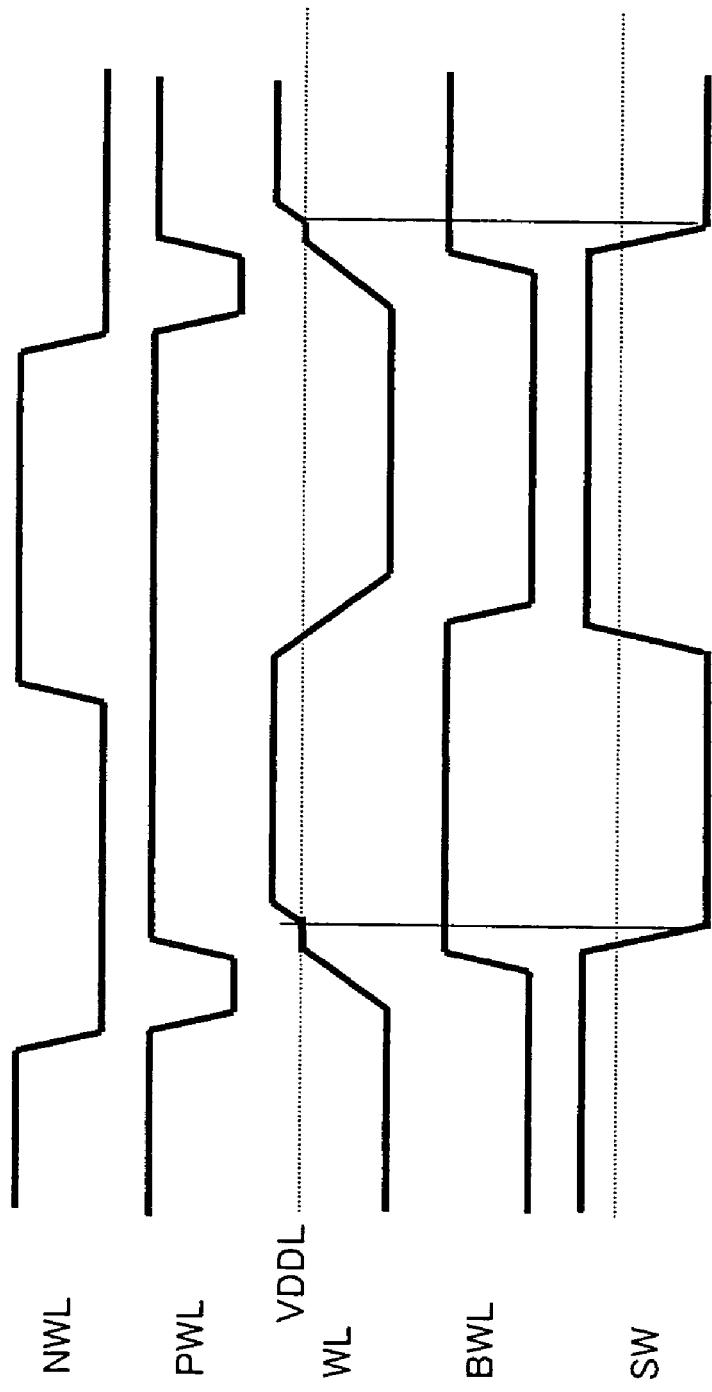
FIG. 8 is a waveform chart showing an operation-timing waveform of a word line drive circuit in a semiconductor memory device according to an embodiment 4 of the present invention.
Figure 9:
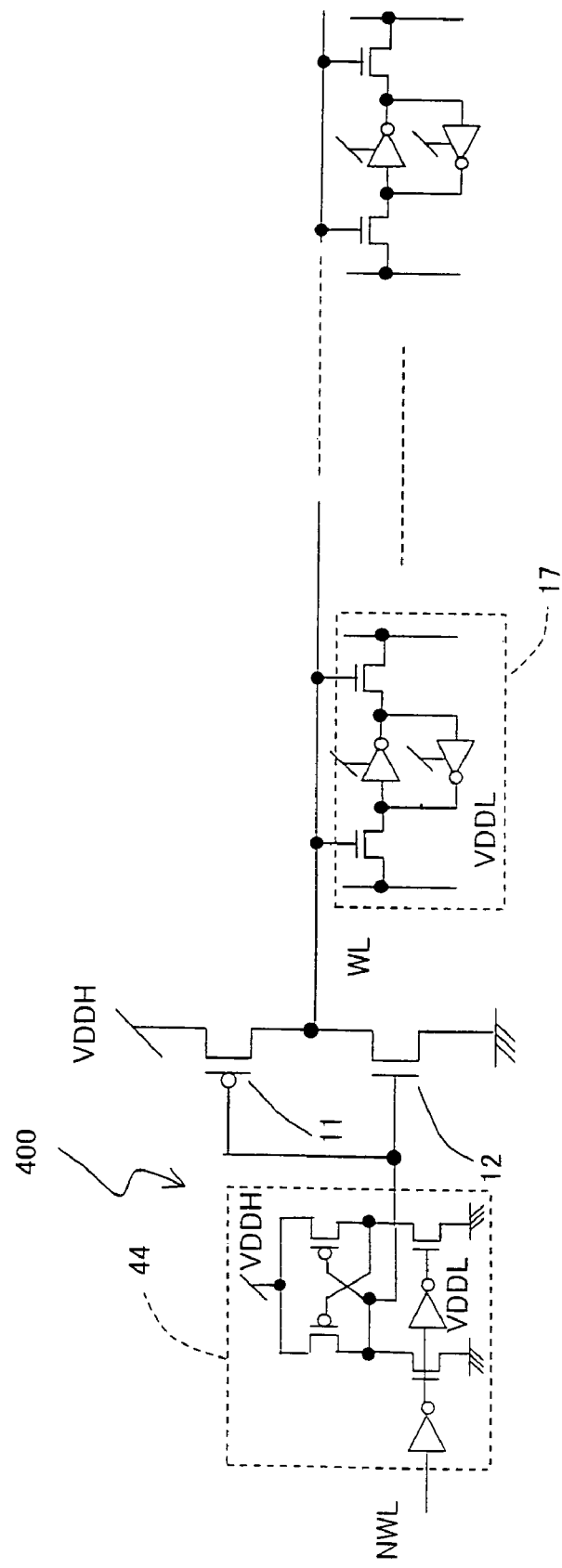
FIG. 9 is a circuit diagram showing a construction of a word line drive circuit of a related art.
Figure 10:
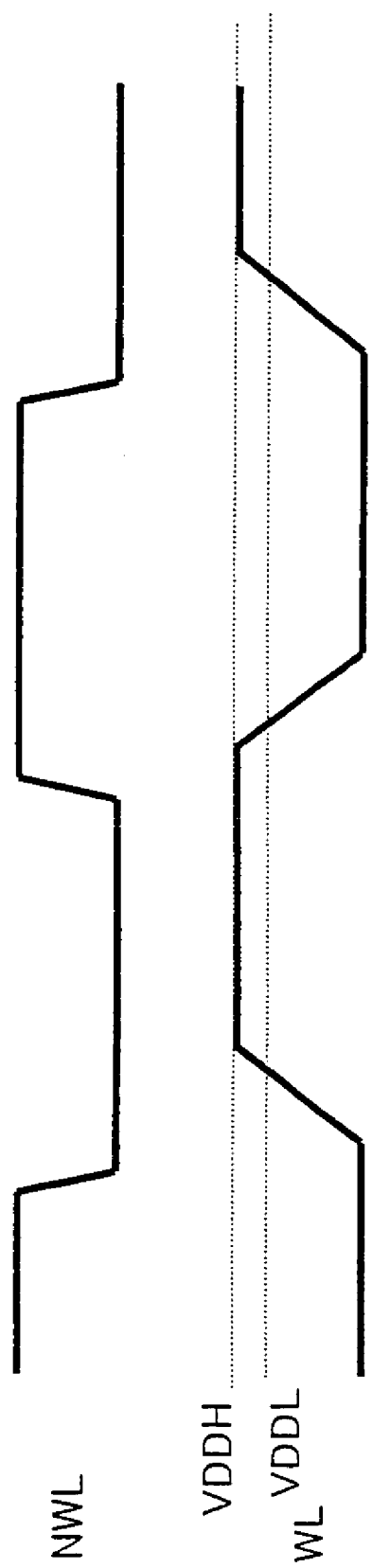
FIG. 10 is a waveform chart showing an operation-timing waveform of a word line drive circuit in a semiconductor memory device of a related art.

A word line drive circuit according to an embodiment 4 is described with reference to FIG. 7 and FIG. 8.

Components with same as or similar function to those in FIG. 1, which shows the embodiment 1, are attached with the same reference letters or numerals, and their description is omitted for ease of explanation. In the word line drive circuit 420 of the embodiment 4, a switch circuit 40 and a switch control circuit 43 are provided as a circuit for a word-line-voltage increasing instead of the capacitor drive circuit 15 and the coupling capacitor 16. Other construction is the same as FIG. 1.

The switch circuit 40 includes a p-channel transistor 41, which is provided between a power supply, which supplies a power supply voltage VDDH higher than the power supply voltage VDDL supplied to other circuit portions, and the word line WL; and a level conversion circuit 42.

AND logic of the inversion signal, which is inversed from the input NWL by inverter 43a, and the output signal BWL of the timing adjusting circuit 14 is obtained by an AND circuit 43b in the switch control circuit 43. The switch control circuit 43 controls the switch circuit 40 based on the output of the AND circuit 43b.

In this word line drive circuit 420, when the input NWL falls, the potential of the word line WL rises similarly to the embodiment 1. Then, when the output signal BWL of the timing adjusting circuit 14 changes to a high level VDDL, the output of the switch control circuit 43 changes to a high level. Furthermore, the level conversion circuit 42 turns the output SW to a low level, and turns the p-channel transistor 41 ON. Thus, a voltage of the word line in a high impedance state is pulled up to a higher VDDH level.

Next, when the input NWL rises, the n-channel drive transistor 12 turns ON, and the output of the switch control circuit 43 changes to a low level. As a result, the level conversion circuit 42 outputs the high level of VDDH potential, and the p-channel transistor 41 changes to an OFF state. In this state, the gate of the p-channel transistor 41 becomes the same VDDH potential as a source potential. Therefore, a leakage current can be reduced extremely.

According to this embodiment, an increased potential can be obtained on the word line WL similarly to the embodiment 1.

In addition, a logic circuit, to which writing control signal is provided, may be additionally provided. This can stop activation of the switch. Accordingly, a voltage can be increased only in writing.

As described above, the semiconductor memory device include a circuit for turning the p-channel transistor 11 right after the word line WL becomes a high level, i.e., the OR circuit 13 and the timing adjusting circuit 14. Accordingly, since the word line WL is in a high impedance state, the potential of the word line WL can be a potential higher than the supplied power supply voltage VDDL by the switch circuit 40 and the switch control circuit 43, which are additionally provided.

Moreover, the switch circuit 40 is controlled based on the writing control signal. Accordingly, it is possible to increase a voltage only in writing in same manner of the voltage increasing method by the capacitor drive circuit. Since the switch circuit 40 increases a voltage only in writing, it is possible to effectively improve the minimum voltage of operation without fine adjustment of the increased voltage of the word line in order to prevent data corruption in reading.

The difference between the power supply voltage supplied to the switch circuit and the switch control signal voltage is eliminated. Accordingly, a leakage current produced in an OFF state of the switch circuit can be effectively eliminated.

What is claimed is:

1. A semiconductor memory device comprising:
   a word line drive circuit including a drive transistor disposed between a positive power supply and a word line;
   a circuit for turning said drive transistor OFF after an output of said word line drive circuit reaches a high level; and
   a word-line-voltage increasing circuit for increasing a voltage of said word line after said drive transistor turns OFF, wherein:
   said word-line-voltage increasing circuit includes a coupling capacitor, one end of which is connected to said word line, and a capacitor drive circuit, an output end of which is connected to the other end of said coupling capacitor, and
   said capacitor drive circuit switches its output from a low level to a high level at a timing when said drive transistor is OFF.

2. The semiconductor memory device according to claim 1 further comprising a memory cell, which is a static memory cell, connected to said word line.

3. The semiconductor memory device according to claim 1, wherein said coupling capacitor includes a line running along said word line.

4. The semiconductor memory device according to claim 3, wherein said line running along the word line has different length from said word line.

5. The semiconductor memory device according to claim 4 further comprising a predetermined number of memory cell arrangement data arranged in the word-line running direction, wherein
   said memory cell arrangement data includes a first memory cell arrangement data which has the word line and the line running along the word line of a memory cell arrangement unit, and a second memory cell arrangement data which has the word line of a memory cell arrangement unit, and does not have the line running along the word line,
   a necessary number of the first memory cell arrangement data to obtain a predetermined value of the coupling capacitor is continuously arranged in the predetermined number of memory cell arrangement data, and the other arranged memory cell arrangement data is the second memory cell arrangement data.

6. The semiconductor memory device according to claim 3, wherein said line running along the word line in said coupling capacitor is formed in the same wiring layer as said word line, and is divided for every one memory cell unit or every two or more memory cell units connected to said word line,
   each divided line running along the word line is backed by other wiring line which runs along the word line on an upper layer on or above said word line.

7. The semiconductor memory device according to claim 1, wherein the output of said word line drive circuit is a control input signal for turning said drive transistor OFF.

8. The semiconductor memory device according to claim 1, wherein the output of said word line drive circuit is an input signal of said capacitor drive circuit.

9. The semiconductor memory device according to claim 1, wherein a writing control signal is provided to said word-line-voltage increasing circuit, said word-line-voltage increasing circuit increases a voltage of said word line only in writing.

10. The semiconductor memory device according to claim 9, wherein a column decoding signal is provided to said word-line-voltage increasing circuit as a control signal,
    a signal of a global word line is provided to said word line drive circuit,
    a plurality of said word line drive circuits are connected to said global word line,
    said column decoding signal selects whether the word-line-voltage increasing circuit is activated or not in wiring.

11. A semiconductor memory device comprising:
    a word line drive circuit including a drive transistor disposed between a positive power supply and a word line;
    a circuit for turning said drive transistor OFF after an output of said word line drive circuit reaches a high level; and
    a word-line-voltage increasing circuit for increasing a voltage of said word line after said drive transistor turns OFF, wherein:
    said word-line-voltage increasing circuit is a switch circuit, which is provided between a voltage supply, which supplies a voltage higher than a power supply voltage of said positive power supply and said word line, and
    said switch circuit turns ON after said drive transistor turns OFF.

12. The semiconductor memory device according to claim 11, wherein a signal is provided to said switch circuit from the word line drive circuit as an ON/OFF control signal,
    said switch circuit includes a level conversion circuit, which changes said signal from the word line drive circuit into the voltage higher than the power supply voltage supplied to said word line drive circuit.

13. The semiconductor memory device according to claim 11, wherein a writing control signal is provided to said switch circuit as an ON/OFF control signal,
    said switch circuit responds to the signal from the word line drive circuit only in writing.

* * * * *